US006998910B2

(12) United States Patent
Hezar et al.

(10) Patent No.: US 6,998,910 B2
(45) Date of Patent: Feb. 14, 2006

(54) AMPLIFIER USING DELTA-SIGMA MODULATION

(75) Inventors: Rahmi Hezar, Plano, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 10/762,819

(22) Filed: Jan. 22, 2004

(65) Prior Publication Data

US 2005/0162222 A1 Jul. 28, 2005

(51) Int. Cl.
H03F 3/38 (2006.01)

(52) U.S. Cl. .................... 330/10; 330/291; 341/143
(58) Field of Classification Search ................ 330/10, 330/207 A, 251, 291; 341/143
See application file for complete search history.

(56) References Cited

U.S. PATENT DOCUMENTS

| 5,103,228 | A | | 4/1992 | Voorman et al. |
| 5,305,004 | A | | 4/1994 | Fattaruso |
| 5,767,740 | A | * | 6/1998 | Fogg ........................... 330/10 |
| 5,777,512 | A | * | 7/1998 | Tripathi et al. ......... 330/207 A |
| 6,275,177 | B1 | | 8/2001 | Ho et al. |
| 6,466,087 | B1 | | 10/2002 | Ruha |
| 6,552,606 | B1 | * | 4/2003 | Veltman et al. ............... 330/10 |
| 6,586,991 | B1 | * | 7/2003 | Masuda et al. ............... 330/10 |
| 6,628,166 | B1 | * | 9/2003 | Delano ....................... 330/251 |

(Continued)

OTHER PUBLICATIONS

"A Multibit Data-Sigma Audio DAC with 120-dB Dynamic Range", Ichiro Fujimori, Akihiko Nogi and Tetsuro Sugimoto, IEEE Journal of Solid-State Circuits, vol. 35, No. 8, Aug. 2000, pp. 1066-1073.

Feb. 5, 2002 Institute of Electrical and Electronics Engineers, 2002 Digest of Technical Papers pp. 218-219, and 2002, month/date are unknown, Visuals Supplement 2002 to the Digbest of Technical Papers, pp. 172,173, 456, IEEE International Solid-State Circuits conference, Volume Forty-Five, ISSN 0193-6530, 13.3 "A Dual-Mode 80MHz Bandpass $\Delta\Sigma$ Modulator for a GSM/WCDMA IF-Receiver" T. Salo, T. Hollman, S. Lingfors and K. Halonen.

(Continued)

Primary Examiner—Peguy JeanPierre
Assistant Examiner—Khai M. Nguyen
(74) Attorney, Agent, or Firm—Alan K. Stewart; W. James Brady, III; Frederick J. Telecky, Jr.

(57) ABSTRACT

An amplifier and a driver circuit therefor are presented for driving a load according to a system analog input. The amplifier comprises a passive delta-sigma modulator with a passive filter providing a first filtered signal according to a passive filter input and according to a feedback signal, a quantizer coupled with the passive filter and providing a quantized output according to the first filtered signal, and a switching system coupled with the the passive filter and the quantizer. The switching system selectively providing power to a load according to the quantized output and provides the feedback signal to the passive input, wherein a gain amplifier is provided in a feedback loop around the passive delta-sigma modulator.

29 Claims, 10 Drawing Sheets

U.S. PATENT DOCUMENTS

| | | |
|---|---|---|
| 6,646,502 B1 | 11/2003 | Kruiskamp |
| 6,765,436 B1 * | 7/2004 | Melanson et al. ............ 330/10 |
| 6,791,404 B1 * | 9/2004 | Olson et al. .................. 330/10 |
| 2001/0005174 A1 | 6/2001 | Olson et al. |
| 2002/0075068 A1 | 6/2002 | Hsu |
| 2002/0186155 A1 | 12/2002 | Olson et al. |
| 2003/0095013 A1 | 5/2003 | Melanson et al. |

OTHER PUBLICATIONS

"A 1.5V 1mA 80dB Passive ΣΔ ADC in 0.13 μm Digital CMOS Process", IEEE International Solid-State Circuits Conference, Feng Chen, Srinath Ramaswamy and Bertan Bakkaloglu, 2003 Oversampled A/D Converters, Paper 3.1, Feb. 10, 2003, 10 pages.

* cited by examiner

AMPLIFIER USING DELTA-SIGMA MODULATION

RELATED APPLICATIONS

This application is related to U.S. patent application Ser. No. 10/699,585, filed on Oct. 31, 2003, entitled CONTINUOUS TIME FOURTH ORDER DELTA SIGMA ANALOG-TO-DIGITAL CONVERTER, the entirety of which is hereby incorporated by reference as if fully set forth herein.

FIELD OF INVENTION

The present invention relates generally to amplifier systems and more particularly to amplifiers using delta-sigma modulation.

BACKGROUND OF THE INVENTION

Audio annunciators are used in mobile and other communications devices, such as cell phones, speaker phones, etc., wherein an audio signal is amplified and provided to a speaker load. In applications such as cell phones and other mobile systems, the amplifier is powered by batteries, and hence power consumption is an important design consideration. Several driver or amplifier design choices are available for amplifying audio signals in such devices. Many mobile system amplifiers employ complementary transistor pairs or h-bridge networks to drive a speaker load. In Class A, B, and AB amplifiers, the drive transistors are generally operated in a linear mode, whereas Class D amplifier transistors are switched between two distinct states (e.g., full on or full off).

Typical Class AB amplifiers are capable of achieving respectable signal-to-noise plus distortion ratios (SNDR), for example, about 80 dB for audio applications, but have poor efficiency ratings, such as about 30 to 40% or less. For mobile applications, such as high-quality multi-media and audio polyphonic ringers for laptop computers and mobile phones, the efficiency shortcomings of such amplifiers can lead to over-heating problems and excessive power consumption. Because of the switch mode operation, Class D amplifiers offer power consumption efficiency advantages that are desirable in mobile phones and other battery-powered systems where audio amplification is needed. For example, for cell phones having an 8 OHM speaker load, Class AB amplification can result in 600 mW power dissipation, while Class D amplifiers may dissipate only about 40–50 mW.

FIG. 1 illustrates a conventional Class D amplifier 10 for driving an audio load L (e.g., a speaker) using an h-bridge 30 with transistor switches SW1–SW4. The amplifier 10 includes an integrator 14 that receives a differential analog input signal 12 and a feedback signal from the h-bridge 30 and provides a differential input to plus terminals of two comparators 16a and 16b. The minus terminals of the comparators 16 are coupled with a triangle-wave input signal from a ramp generator 18, and the comparators provide a pair of pulse width modulated (PWM) signals to a logic circuit 20. The logic circuit 20 provides switching signals S1–S4 to the h-bridge 30 so as to selectively activate the switches SW1–SW4, respectively, whereby the load L is selectively coupled with positive and negative voltages V+ and V−, respectively.

Although consuming less power, Class D amplifiers such as the amplifier 10 in FIG. 1 suffer from low power supply rejection ratio (PSRR), thus requiring the addition of voltage regulation components for the power source that provides the amplifier power rails V+ and V−. Furthermore, conventional Class D amplifiers suffer from poor SNDR performance, typically in the 55 to 65 dB range with 0.05 to 0.10% power supply distortion. As shown in FIG. 1, the h-bridge 30 is prone to additive power supply noise from the supply rails V+ and V−, which is seen by the load L. In addition, the ramp generator 18 and the quantization noise of the comparators 16 create harmonic distortion at the load L. While providing the feedback from the load L to the integrator 14 helps alleviate the h-bridge distortion, this closed loop folds the harmonic noise of the PWM signals and the ramp generator 18 into the audio band, thus degrading the audio quality of the amplifier system 10. The integrator is typically limited to first order filtering (e.g., single pole and zero) in order to avoid instability problems associated with second or higher order filtering, whereby the PSRR and SNDR capabilities of the conventional Class D amplifier 10 are generally limited. Accordingly, there is a need for improved amplifiers that provide better efficiency, power supply noise rejection, and signal-to-noise plus distortion rejection capabilities.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to Class D and other amplifiers for use in audio or other applications, which include passive delta-sigma modulation combined with an active filter in a feedback loop around the passive delta-sigma modulator to reduce the adverse effects of quantizer noise. The invention may be employed in mobile phones and other situations in which low noise amplification is needed with minimal power consumption for creating audio or other powered signals, wherein power supply noise and harmonic distortion are passed through a filter system and corrected by a high gain amplifier. As a result, improved Class D and other amplifiers are achievable with superior PSRR and SNDR without significantly sacrificing the power consumption advantages of Class D amplifiers.

One aspect of the invention provides an amplifier with a switching system to selectively provide power to a load according to a quantized output, and a driver system receiving a system analog input and providing the quantized output to the switching system. In one implementation, the quantized output is a two-level signal, wherein the switching system includes an h-bridge circuit and a logic circuit that provides switching signals to the h-bridge switches according to the quantized output. The driver system comprises a passive circuit and an active filter, where the passive circuit includes a quantizer providing the quantized output representative of a quantizer input signal, and a passive filter that provides the quantizer input signal according to a passive filter input and a feedback signal from the switching system. The active filter is situated in an outer feedback loop to provide the input to the passive filter based on the system input and feedback from the switching system.

The passive and active filters are second order low pass filters in one example, wherein the invention facilitates high order filtering of power supply noise from the h-bridge, and hence improved PSRR, as well as high gain filtering of quantization noise and other harmonic distortion, whereby higher SNDR performance can be achieved while realizing the power consumption advantages of Class D amplification. In this regard, the invention does not employ PWM circuitry, and thus avoids the harmonic distortion associated with ramp generator circuits of conventional Class D audio amplifiers. In one implementation, the driver system includes a digital delta-sigma modulator providing a two-level system analog input based on a digital system input.

Another aspect of the invention relates to an amplifier driver system for providing a quantized output to a load switching system according to a system analog input. The driver system comprises a passive circuit with a quantizer providing a quantized output representative of a quantizer input signal, and a passive filter coupled with the quantizer, where the passive filter provides the quantizer input signal according to a passive filter input and a feedback signal. The driver system further comprises an active filter that provides the passive filter input according to a difference between a system analog input and the feedback signal and according to a gain factor. In one example, the quantized output is a two-level signal and the passive and active filters are second order low pass filters, where the gain factor is about 25 or more. The driver system may further comprise a digital delta-sigma modulator providing a two-level system analog input to the driver system.

In yet another aspect of the invention, an amplifier is provided for driving a load according to a system analog input. The amplifier comprises a passive delta-sigma modulator having a passive filter providing a first filtered signal according to a passive filter input and according to a feedback signal. The modulator further includes a quantizer coupled with the passive filter that creates a quantized output according to the first filtered signal, as well as a switching system coupled with the the passive filter and the quantizer, where the switching system selectively provides power to the load according to the quantized output and provides the feedback signal to the passive filter. The amplifier further comprises a gain amplifier and a second filter in a feedback loop around the passive delta-sigma modulator. In addition, a digital delta-sigma modulator may be included in the amplifier, which provides a two-level system analog input to the amplifier.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
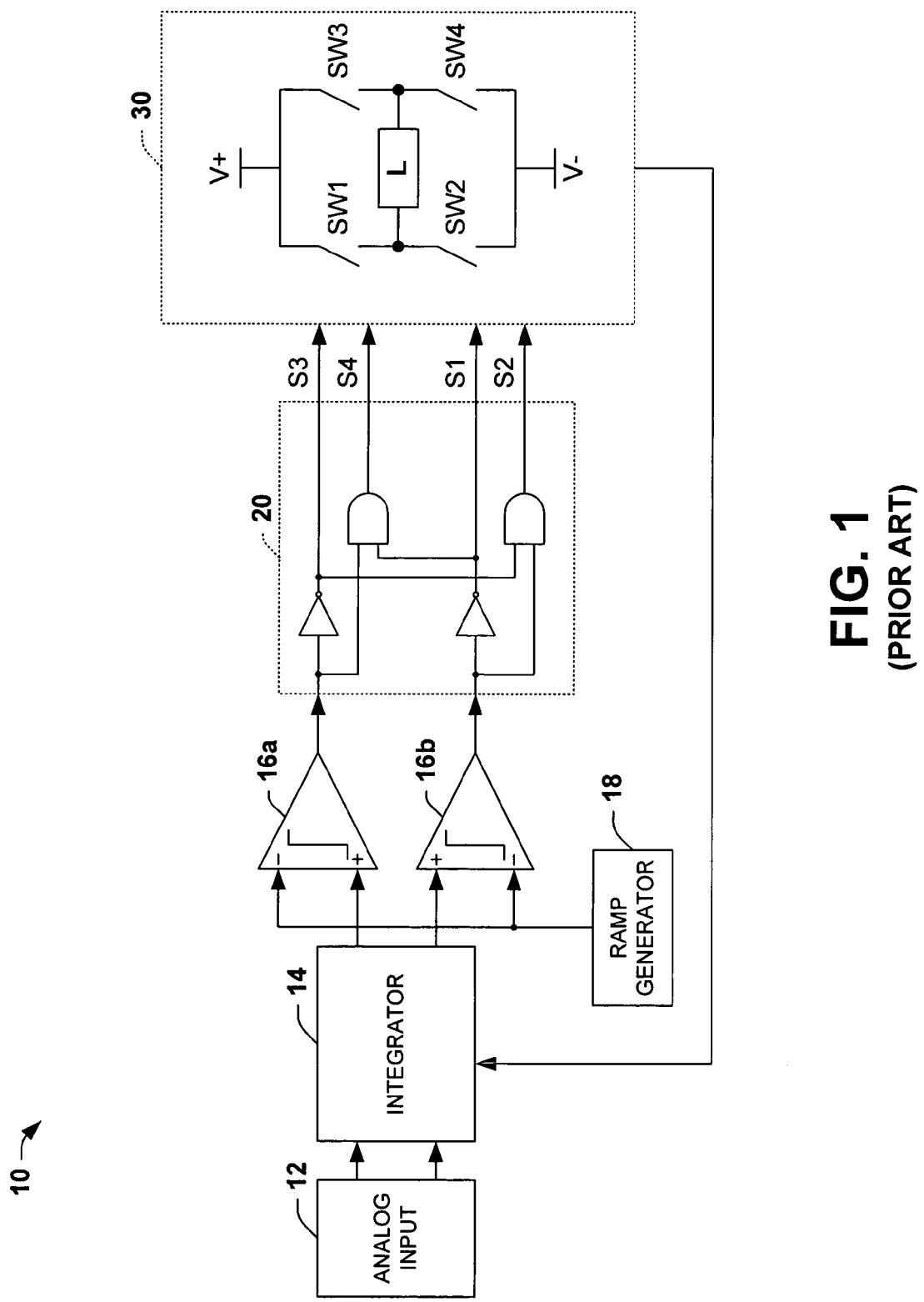
FIG. 1 is a schematic diagram illustrating a conventional Class D audio amplifier using pulse-width-modulation for powering a load.

One or more exemplary implementations of the present invention will now be described with reference to the attached drawings, wherein like reference numerals are used to refer to like elements throughout. The various aspects of the invention are illustrated below in an exemplary amplifier system 50 employing a passive delta-sigma modulator, with a high gain active filter provided in an outer feedback loop around the passive modulator, although the invention and the appended claims are not limited to the illustrated examples.

The inventor has appreciated that delta-sigma modulation may be employed in driving an h-bridge or other switching circuit in audio amplification applications while performing a noise shaping function without significantly increasing power consumption, wherein quantization and other noise power is spread over a bandwidth related to the modulator sampling frequency, thereby reducing the noise density in the band of interest. In addition, the inventor has found the while conventional active delta-sigma modulators typically employ switched capacitor circuits, passive delta-sigma modulators can be employed to avoid switched capacitor leakage issues associated with modern CMOS fabrication processes. In the past, passive delta-sigma modulators and PWM-based Class D audio amplifiers have generally been restricted to lower order filters, wherein higher order filtering lengthens the loop delay, resulting in instability. In the exemplary amplifiers illustrated and described below, the forward signal path includes no switching components, whereby capacitor leakage problems of conventional active delta-sigma modulators can be mitigated or avoided, and stable higher order filtering is achieved without significantly degrading amplifier efficiency.

Figure 2:
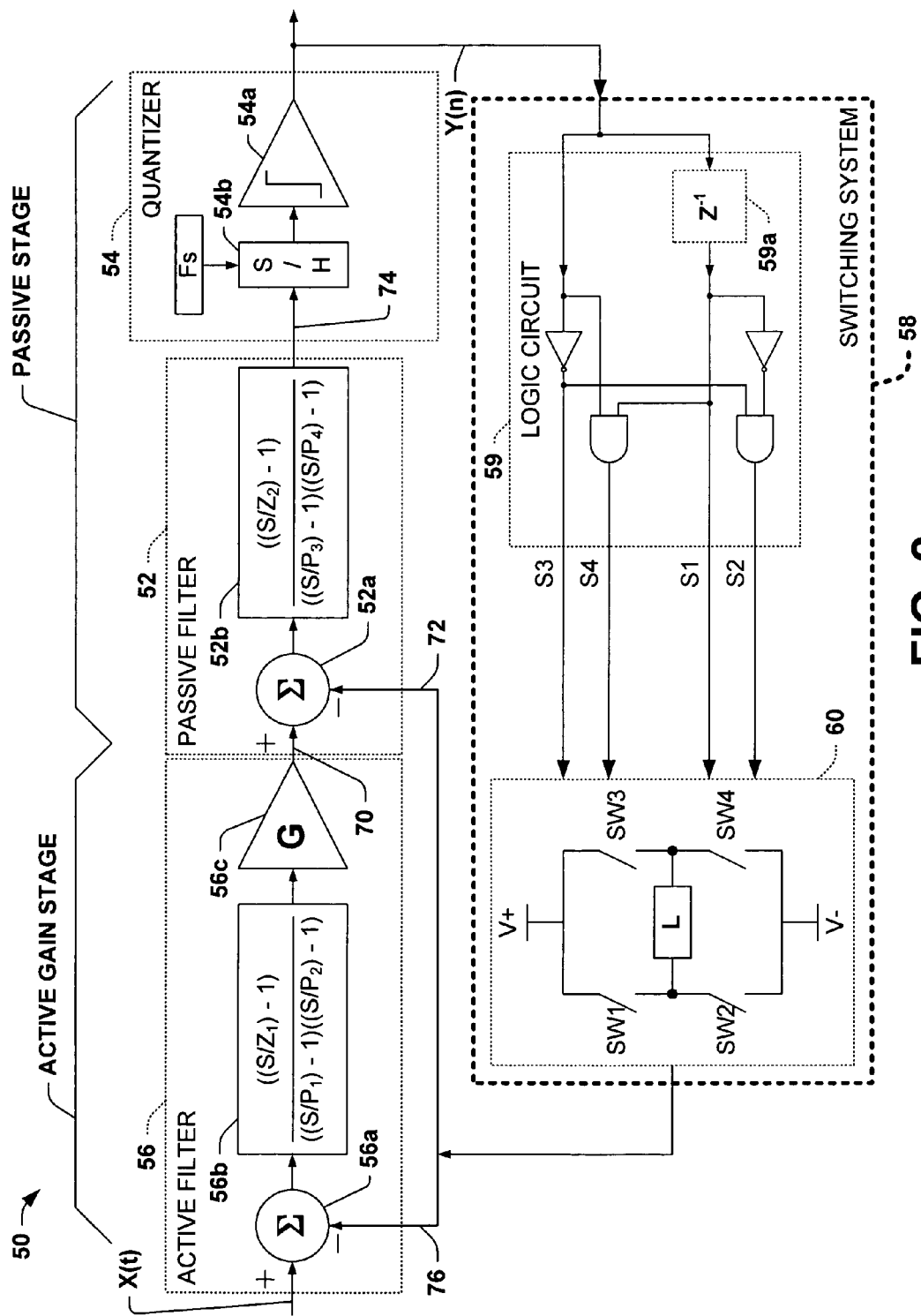
FIG. 2 is a schematic diagram illustrating an exemplary fourth order delta-sigma based audio amplifier having a passive delta-sigma modulator and an active filter stage in an outer feedback loop around the passive modulator in accordance with the present invention.
Figure 3:
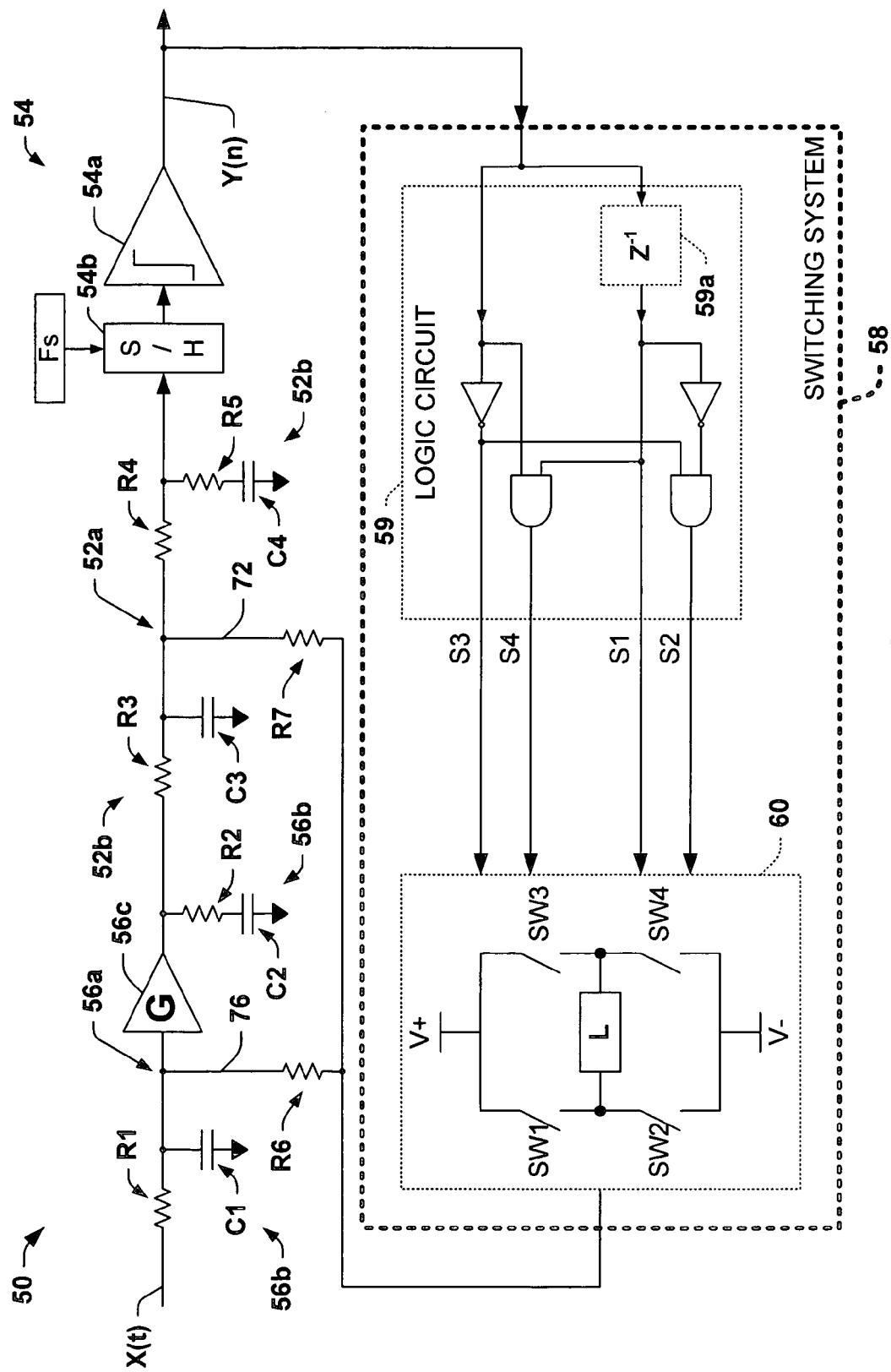
FIG. 3 is a schematic diagram further illustrating the exemplary amplifier of FIG. 2.

Referring to FIGS. 2 and 3, an exemplary delta-sigma based Class D audio amplifier system 50 is illustrated, comprising a passive filter 52 and a quantizer 54 in a forward signal path of a passive delta-sigma converter stage or circuit. The quantizer 54 comprises a sample/hold (S/H) circuit 54b receiving a first filtered analog signal 74 from the passive filter 52, as well as a comparator 54a that creates a 2-level (e.g., single bit) quantized output Y(n). The filtered signal 74 is sampled at a sampling frequency Fs, for example, about 56 MHz in the illustrated implementation. The system 50 further comprises an active filter 56 in an active outer feedback gain stage or circuit along the forward signal path, and a switching system 58 in a feedback signal path, including a logic circuit 59 with a latch or delay circuit 59a, and an h-bridge circuit 60. The h-bridge 60 comprises first, second, third, and fourth transistor switching devices SW1–SW4, respectively, which are selectively activated (e.g., closed) via switching signals S1–S4, respectively, from the logic circuit 59.

The controlled activation of the switching devices SW1–SW4 provides selective coupling of the load L with positive and negative supply voltages V+ and V−, respectively. The first switching device SW1 operates to selectively couple a first load terminal with V+, SW2 selectively couples the first load terminal with V−, SW3 selectively coupes a second load terminal with V+, and SW4 selectively couples the second load terminal with V1 according to the quantized output Y(n) via the switching signals S1–S4, respectively. Any switching system may be employed to selectively provide power to a load, wherein the present invention is not limited to the illustrated h-bridge configuration of the exemplary amplifier system 50. The logic circuit 59 is coupled with the quantizer 54 and the h-bridge circuit 60, and provides the switching signals S1–S4 according to the 2-level quantized output Y(n).

In one possible implementation, a logic circuit 59 could simply provide activation of SW1 and SW4 for one state of the quantized output Y(n), and activation of SW2 and SW3 for the other state. In the illustrated example, the logic circuit 59 includes gates and a delay element 59a to assert S1 and S4 when the Y(n) is a first state ("1"), and to assert S2 and S3 when Y(n) is a second state ("0"). The exemplary logic circuit 59 also asserts S1 and S3 when Y(n) transitions from the first state to the second state, and asserts no switching signals when Y(n) transitions from the second state to the first state. Similar logic circuits can be fashioned to alternatively assert S2 and S4 during a transition from the first state to the second state, or generally to assert S1 and S3, or S2 and S4, or to assert no switching devices when the quantized output changes states, in order to reduce wear on the switches and/or to minimize noise spikes during state trasitions.

FIG. 3 illustrates a single-ended implementation of the audio amplifier system 50, although differential implementations are also possible within the scope of the invention. The amplifier system 50 receives a system analog input X(t) for conversion, and the quantizer 54 provides the quantized output Y(n) to the switching system 58 to drive the load L according to the input X(t). The passive filter 52 includes a summing junction or node 52a and a second order low pass filter 52b, with two poles $P_3$ and $P_4$, as well as a zero $Z_2$, wherein the exemplary filter 52b is free of switching components to avoid leakage problems associated with switched capacitor circuits. As illustrated in FIG. 3, the pole $P_3$ is set by the values of resistor R3 and capacitor C3, the pole $P_4$ is set by the values of resistors R4 and R5, and capacitor C5, and the zero $Z_2$ is set by the values of resistor R5 and capacitor C4. The feedback from the h-bridge circuit 60 is provided to the summing node 52a via a resistor R7 to provide a feedback signal 72 indicative of the current or voltage being applied to the load L.

The active filter stage 56 comprises a summing junction 56a and a second low pass filter 56b, also free of switching components, as well as an amplifier 56c, such as an operational amplifier or other amplifier circuit. While the amplifier 56c is illustrated in FIGS. 2 and 3 as a single component, any amplifier may be employed in accordance with the invention, which may be free of switching components in the forward signal path of the amplifier system 50. The amplifier 56c, moreover, may include multiple components, for example, an operational amplifier with resistances in a feedback loop (not shown) to set the amplifier gain factor. In addition, the filter 56b may, but need not, be designed with poles and zero(s) corresponding to those of the first filter 52b, wherein the amplifier 56c may be combined with the filter 56b in an active filter configuration that is free of switching components, as in the exemplary implementation of FIG. 3, within the scope of the invention.

The filter 56b is implemented without switching components, having two poles $P_1$ and $P_2$, as well as a zero $Z_0$, receiving the system analog input X(t) and providing the passive filter input 70 according to the input X(t) and a feedback signal 76 through resistor R6 that indicates the power applied to the load L, as illustrated in FIGS. 2 and 3. The pole $P_1$ is set by the values of resistor R1 and capacitor C1, the pole $P_2$ is set by the values of resistor R2, the output impedance of the amplifier 56c and the capacitor C2, and the zero $Z_2$ is set by the values of resistor R2 and capacitor C2. In the illustrated system 50, the passive and active filters 52 and 56 are second order low pass filters, wherein poles of the active filter 56 may, but need not be substantially matched with poles of the passive filter 52. In one example described further below, the passive filter 52 has two poles, both of which are at about 100 kHz for audio amplification, with a zero at about 1.25 MHz, and the active filter 56 has poles at about 50 and 100 kHz and a zero at 1.25 MHz. The active stage gain may be any value, such as greater than about 25, preferably about 250 in the illustrated system 50.

The passive filter 52, quantizer 54, and the switching circuit 58 thus form a passive delta-sigma modulator providing a two-level quantized output Y(n) used to selectivcely provide power to the load L. The active filter 56 provides a high gain outer feedback loop, and together with the passive delta-sigma modulator, forms a delta-sigma based amplifier driver system. The amplifier 50 and the driver system thereof provides fourth order noise shaping without the instability associated with higher order PWM based Class D designs, by virtue of the filters 52b and 56b, each of which is a second order low pass configuration in the system 50 (e.g., integrator). The closed loop configuration of the driver system provides filtering of power supply ripple and other noise in the h-bridge circuit 60, where such noise is fourth order noise shaped by the filters 52b and 56b. In addition, the avoidance of pulse-width-modulation in the amplifier 50 mitigates harmonic distortion associated with the tranglewave signals typically found in PWM based amplifiers. Further, the amplifier system 50 advantageously provides fourth order noise shaping of any input noise associated with the quantizer 54, which is reduced by the gain factor of the amplifier 56c. Thus, the system 50 attains the power efficiency advantages of Class D amplifier designs, while providing superior noise immunity (e.g., PSRR and SNDR performance) compared with conventional PWM-based amplifiers.

In operation, the passive filter 52 receives the filter stage analog input 70 and the first analog feedback signal 72 at the summing circuit 52a, and provides a first filtered analog signal 74 as an input signal to the quantizer 54 according to the difference between the filter stage input 70 and the first feedback signal 72. The quantizer 54 provides the 2-level output Y(n) according to the first filtered analog signal 74, and the switching circuit provides the corresponding set of switching signals S1–S4 to drive the load L according to the quantized output Y(n), wherein the logic circuit 59 provides for smooth transitions between output states in the illustrated example.

The active stage receives the system input X(t) and provides the filter stage analog input 70 via the second filter 56b and the amplifier 56c according to the difference between the system input X(t) and a second feedback signal 76 from the switching system 58 scaled by the gain factor of the amplifier 56c. The amplifier 56c preferably has a high gain*bandwidth product, wherein the gain of the active filter 56 and the bandwidth of the filter poles are set according to the amplifier gain*bandwidth product and the desired frequency band for a given application. In the illustrated example, the poles and zeroes of the filters 52b and 56b generally correspond with one another, although strict pole and zero matching are not required within the scope of the invention. Further, the illustrated filters 52c and 56c are both second order low pass filters, although filters of other orders and other types (e.g., bandpass), may be used in accordance with the invention. Noise associated with the input of the quantizer 54 is reduced by the gain factor of the amplifier 56c, whereby the gain of the amplifier 56c is preferably high, such as greater than about 25, for example, about 250 in one implementation, although stable operation is believed to be possible with gains of 500 or more. In addition, the amplifier 50 may be adapted for use in a variety of applications across a wide bandwidth range, wherein the gain and pole/zero locations in the system 50 can be selected for any particular application.

Referring also to FIGS. 4–7, FIGS. 4–6 illustrate frequency response plots 100, 110, and 120 showing simulation results for the exemplary amplifier system 50 in open and closed loop operation with harmonic distortion and with distortion plus power supply noise, respectively. In these simulations, the single tone was provided at the input X(t) at about 9.44 kHz in the audio band, wherein the quantizer 54 was simulated with the sample/hold 54b operating at a sampling frequency of about 56 MHz, although other sampling rates may be used. The simulated performance results illustrate the effects of additive and multiplicative distortion, plus 2nd harmonic distortion for multiple tones, wherein three sine wave tones were used to model these noise sources. One tone was located inside the audio band at about 4.29 kHz at about −40 dB, and two other tones were situated near the sampling frequency (56 MHz) at about −40 dB, with a second harmonic at −80 dB.

Figure 4:
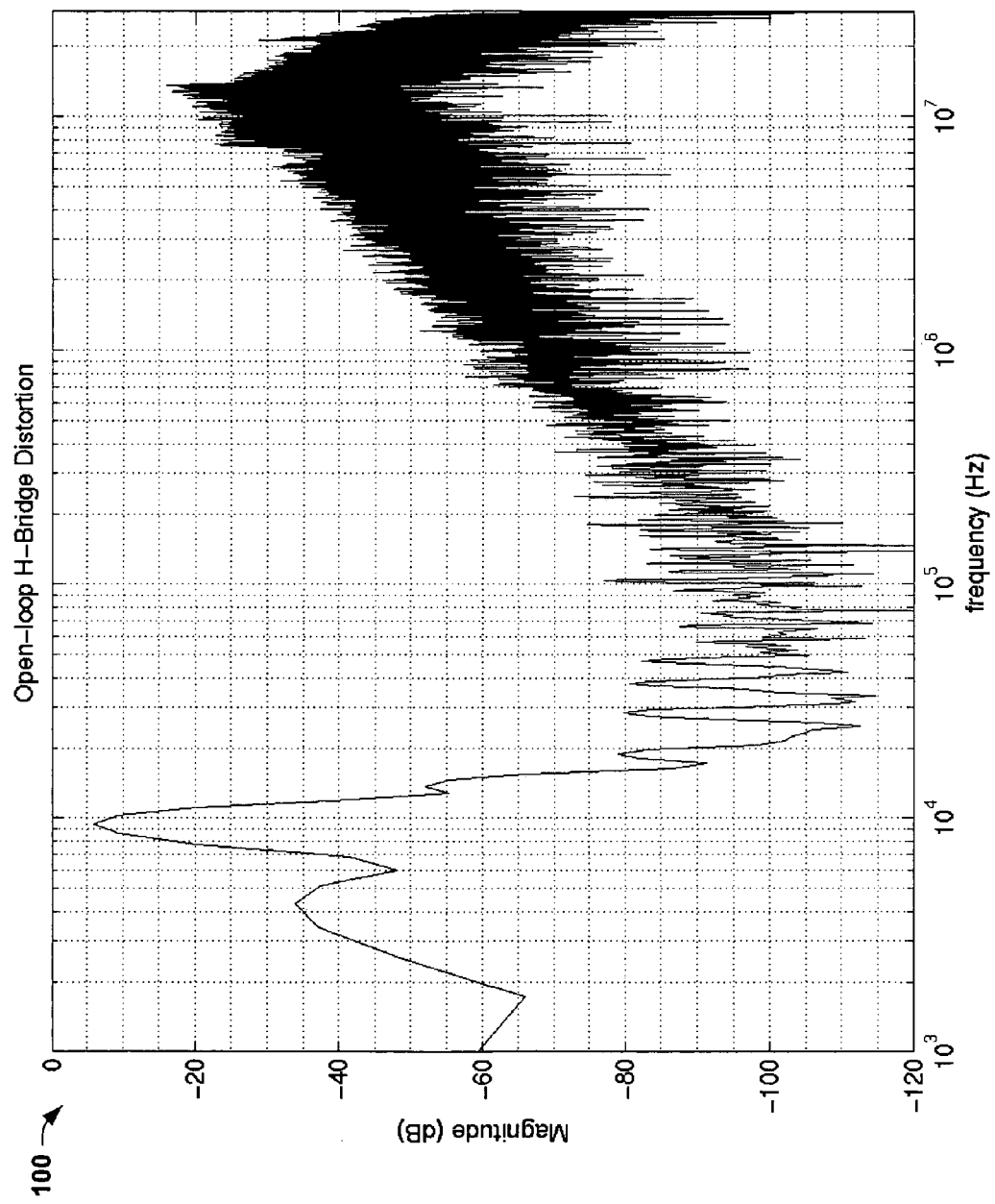
FIGS. 4–6 are frequency response plots illustrating simulation results for the exemplary amplifier of FIGS. 2 and 3 in open and closed loop operation with harmonic distortion and with distortion plus power supply noise, respectively.
Figure 5:
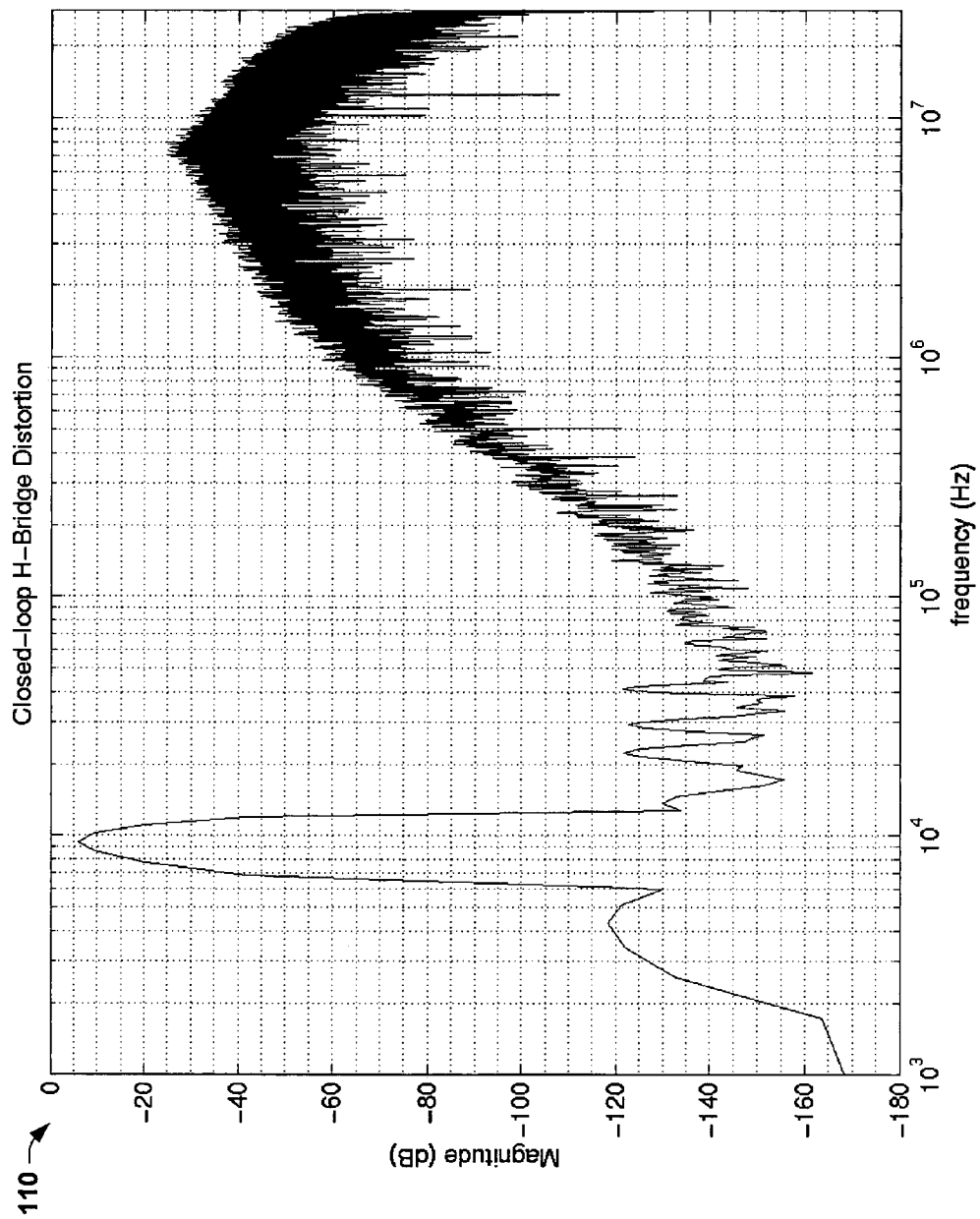
Figure 6:
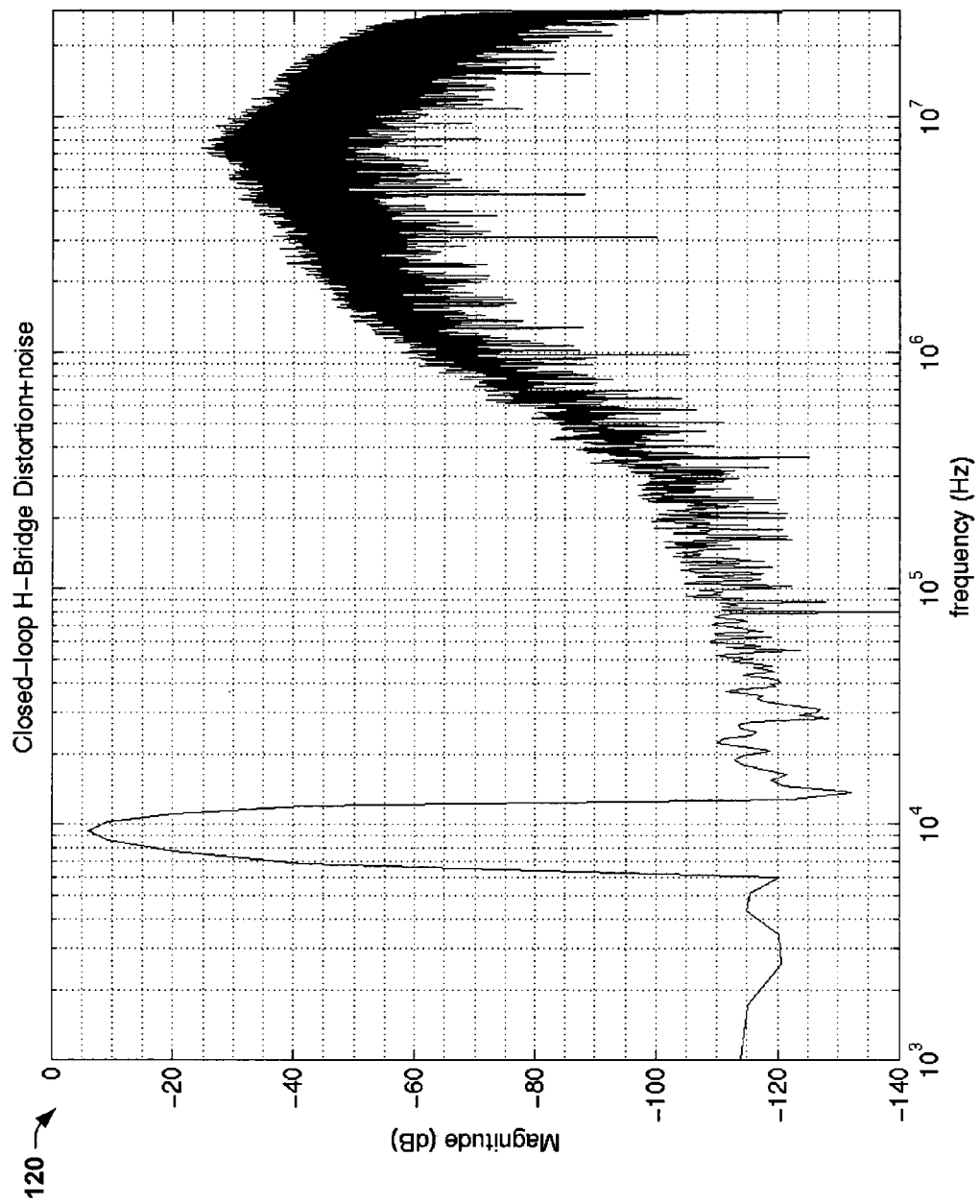
Figure 7:
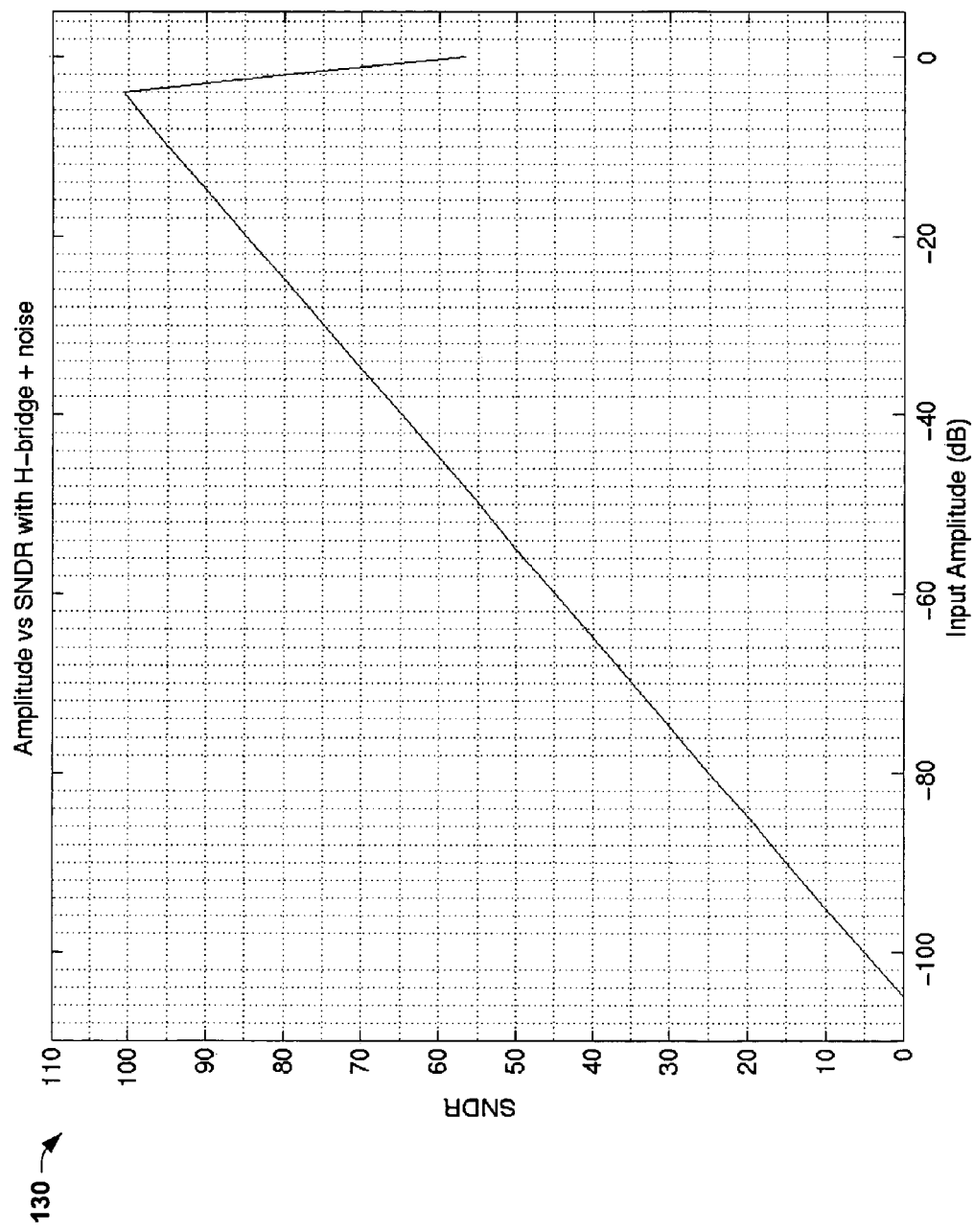
FIG. 7 is a plot of SNDR vs. input amplitude for the exemplary amplifier of FIGS. 2 and 3.

The plot 100 of FIG. 4 shows the simulated open-loop performance of the amplifier system 50 for a 30 kHz bandwidth with no feedback to determine a comparative baseline for the noise shaping capabilities in the closed loop simulations of FIGS. 5 and 6. The open loop performance yields an SNDR of about 30 dB. The plot 110 in FIG. 5 shows the amplifier system 50 operated in closed loop with modeled h-bridge distortion with no simulated amplifier or comparator noise, yielding a PSRR of 80 dB with respect to the simulated in-band noise at 4.3 kHz, and SNDR performance of about 110 dB. The plot 120 in FIG. 6 further simulates the effects of amplifier noise (e.g., amplifier 56c) and comparator noise (e.g., comparator 54b), wherein the system 50 achieves about 80 dB PSRR and an SNDR of about 98 dB. FIG. 7 illustrates a plot 130 showing simulated SNDR vs. input amplitude performance of the amplifier 50, with amplifier and comparator noise and with h-bridge distortion.

The following Table 1 illustrates simulated SNDR performance of the system 50 at various different noise conditions, as well as comparative results for the conventional PWM-based Class D amplifier design of FIG. 1, wherein the SNDR results are in dB and the switching numbers represent the total number of switching transitions at the h-bridge circuit 60. In this regard, lower switching activity is desired for extended operational lifetime of the switching devices SW1–SW4 in the bridge 60, and higher SNDR values indicate better noise immunity. In these simulations, the 'ideal' cases correspond to no h-bridge noise, no amplifier or comparator noise, and no hysteresis, HB1 represents an h-bridge circuit 60 with −20 dB of distortion with a second harmonic of about −40 dB, HB2 represents an h-bridge circuit 60 with −40 dB of distortion with a second harmonic of about −60 dB, and HB3 represents −60 dB of distortion with a second harmonic of about −80 dB.

TABLE 1

| Conditions (noise in $nV/(Hz)^{1/2}$ | HB1 SNDR | HB1 Switching | HB2 SNDR | HB2 Switching | HB3 SNDR | HB3 Switching |
|---|---|---|---|---|---|---|
| Ideal PWM | 84 | 1166 | 84 | 1166 | 84 | 1166 |
| Ideal DSM | 130 | 17,931 | 130 | 17,931 | 130 | 17,931 |
| PWM w/ HB only | 48 | 1445 | 65 | 1166 | 78 | 1166 |
| DSM w/ HB only | 92 | 17,687 | 109 | 17,388 | 126 | 17,413 |
| Amp = 25 Comp = 25 | 89.70 | 9467 | 98.28 | 8681 | 98.85 | 8662 |
| Amp = 25 Comp = 50 | 89.27 | 9475 | 98.27 | 8678 | 98.69 | 8659 |
| Amp = 25 Comp = 100 | 88.33 | 9937 | 97.79 | 9185 | 97.99 | 9159 |
| Amp = 50 Comp = 25 | 87.15 | 9452 | 92.63 | 9121 | 92.81 | 9104 |
| Amp = 100 Comp = 25 | 84.39 | 9441 | 86.71 | 9198 | 86.83 | 9185 |
| Amp = 100 Comp = 100 | 84.19 | 9913 | 86.69 | 9445 | 86.69 | 9421 |

As illustrated in the above Table 1, the ideal PWM method has 84 dB SNDR with 1166 switching transitions for the HB1 case, but the ideal new method gives far better SNDR performance of 130 dB (data rows 1 and 2). With H-bridge distortion, the PWM SNDR drops to 48 dB, and the exemplary amplifier system 50 provides SNDR of 92 dB. For the amplifier and comparator noise simulations (data rows 5–10), the SNDR stays at about 84–90 dB for 9000–10,000 switching transitions, wherein the exemplary system 50 of the invention provides consistently better noise performance than the conventional PWM-based amplifier design, allowing a tradeoff between noise performance and switching activity. The inventor has also appreciated that the sampling frequency Fs of the quantizer 54 can be lowered to reduce the switching activity, while maintaining good noise rejection (PSRR and SNDR). In another simulated implementation, Fs was reduced to 7 MHz from 56 MHz in the system 50 for a bandwidth of 30 kHz, wherein an SNDR of about 84 dB was obtained with 1735 switching transitions. In this regard, the system 50 and operating parameters thereof (e.g., Fs) may be adjusted to achieve superior noise performance without significant sacrifice in switching activity compared with PWM amplifiers.

Figure 8:
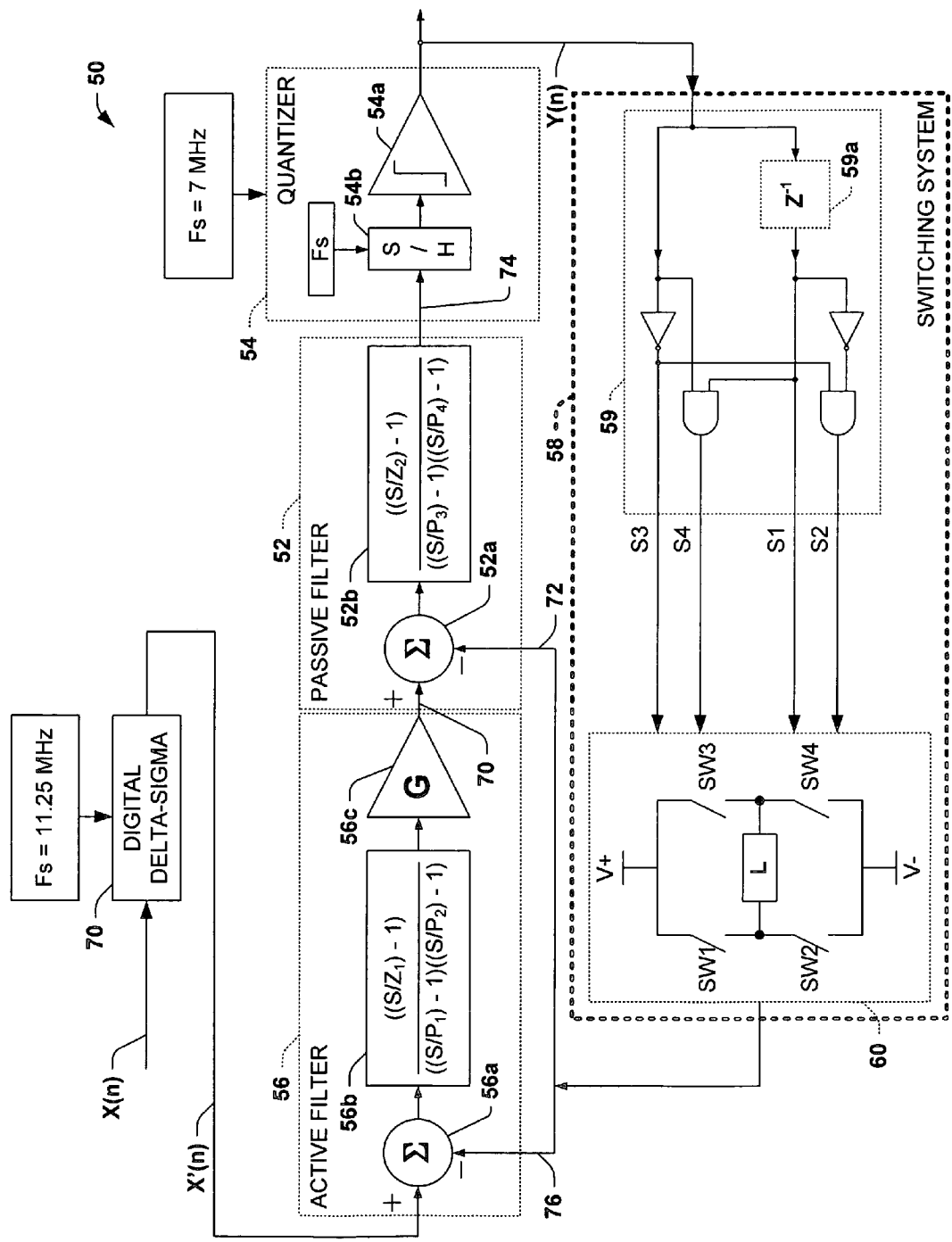
FIGS. 8 and 9 are schematic diagrams illustrating another exemplary amplifier having a digital delta-sigma modulator providing a two-level input to the active filter in accordance with another aspect of the invention.
Figure 9:
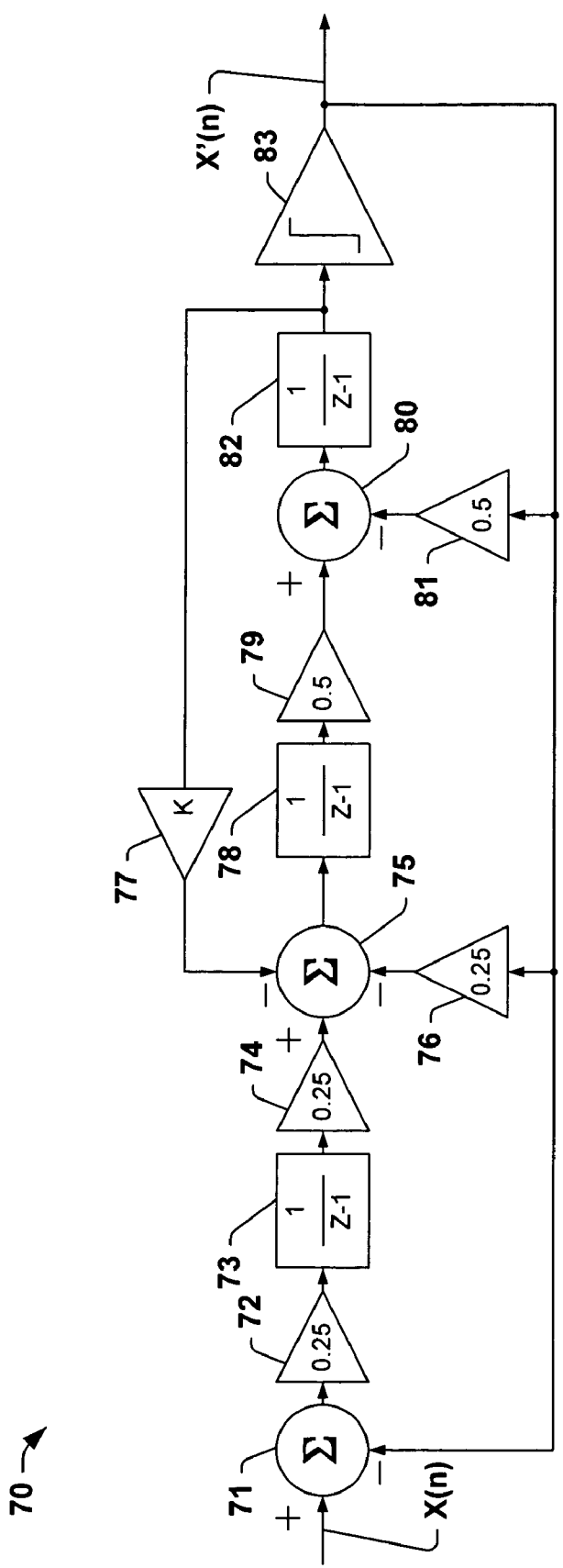

Referring now to FIGS. 8–10B, another aspect of the invention involves providing a digital delta-sigma modulator (e.g., digital DSM) 70 at the input of the active filter 56. In a typical cell phone polyphonic ringer application, the amplifier input signal is an analog signal generated by a multi-level digital-to-analog converter (e.g., D/A or DAC), wherein the input information originates in a digital processing system in the cell phone. For high quality audio applications, a high performance DAC is required (e.g., an 8-bit DAC). The invention provides for reducing the number of levels, for example, from 8 or some other number, down to a two-level amplifier input using a digital DSM 70 as illustrated in FIG. 8, whereby no multi-level DAC is needed. FIG. 9 illustrates one possible digital DSM that may be used in accordance with the invention, although any digital DSM may be used.

The exemplary digital DSM 70 receives a multi-level digital input X(n), for example, an 8-bit signal from a digital system, and creates a 2-level digital output X'(n), which is provided as the driver system input to the active filter 56. The signal X(n) is summed with the digital DSM output feedback signal X'(n) at a summation node 71, and the difference is provided through a first gain stage 72 to a first filter 73 (e.g., 1/(z-1) in this example), and a second gain stage 74. The resulting signal is summed at another summation node 75, together with an output feedback from a third gain stage 76, and a pre-quantizer feedback signal from a fourth gain stage 77. The result is provided to another filter 78 and a fifth gain stage 79 to a third summing node 80. The node sums this signal with the output of another feedback gain stage 81, and the result is provided to a third filter 82. The output of the filter 82 is fed back via the gain stage 77 and is quantized by a comparator 83 to create the 2-level input X(n) to the active filter 56. As illustrated in FIG. 8, because there are four poles and two zeros in the forward driver system signal path, any high frequency noise associated with the comparator 83 is noise shaped in the analog domain prior to the amplifier system quantizer 54*a*. Thus, any such noise is not folded into the audio band. Furthermore, the expense and non-linearity of the conventional DAC is avoided.

Figure 10B:
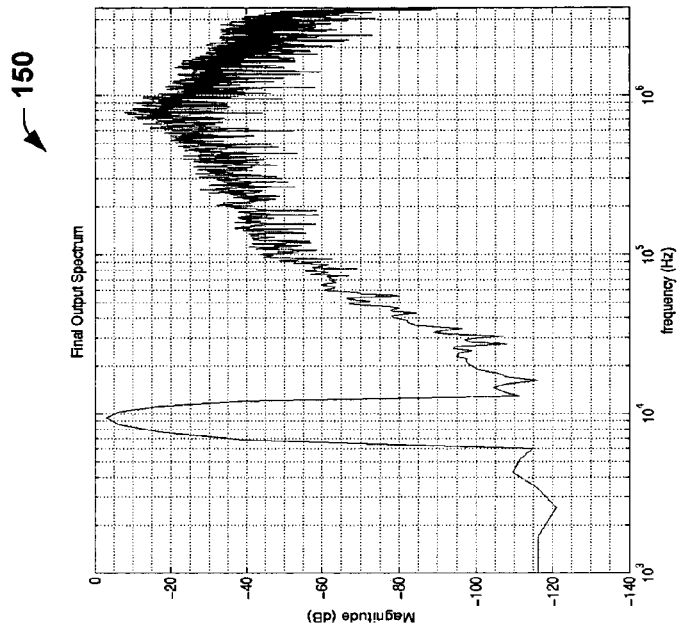
FIGS. 10A and 10B are frequency response plots illustrating performance of the amplifier of FIGS. 8 and 9.
Figure 10A:
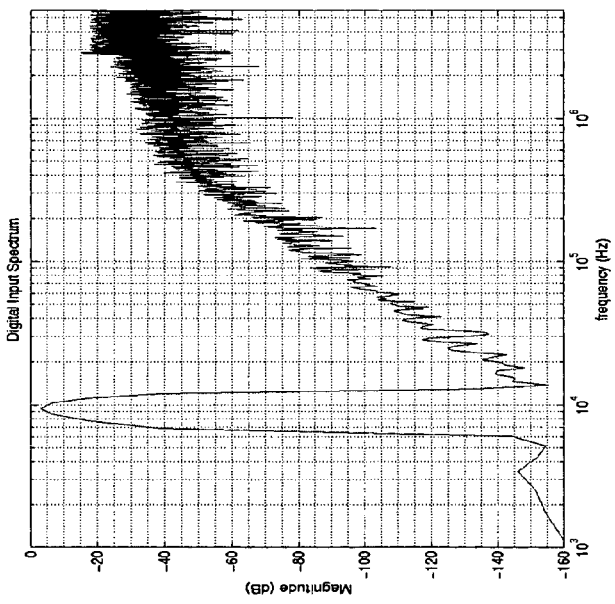

FIG. 10A illustrates a frequency performance plot 140 of the system 50 for the output of the digital DSM 70 (e.g., signal X'(n)), and FIG. 10B illustrates a plot 150 showing the corresponding spectrum of the power delivered to the load L at the h-bridge 60. The following Table 2 illustrates SNDR performance of the system 50 of FIGS. 8 and 9, as well as switching activity, as well as comparative results for the conventional PWM-based implementation of FIG. 1. In the results of FIGS. 10A and 10B, and those of Table 2, the quantizer 54 was sampled at 7 MHz, and the digital DSM 70 was operated at 11.25 MHz. As can be seen in Table 2, the inclusion of the digital DSM to provide a two-level input to the amplifier driver system results in substantially similar SNDR performance (e.g., sacrificing only a few dB), while providing substantially equivalent switching activity for the audio bands compared with the PWM-based approach.

TABLE 2

|  | BW = 10 kHz | BW = 20 kHz | BW = 30 kHz | Switching |
|---|---|---|---|---|
| PWM | 73 dB | 69 dB | 65 dB | 1184 |
| DSM w/ analog input | 109 dB | 98 dB | 84 dB | 1735 |
| DSM w/2-level input | 106 dB | 95 dB | 82 dB | 1796 |

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

The invention claimed is:

1. An amplifier, comprising:
   a switching system comprising at least one switching device to selectively provide power to a load according to a quantized output; and
   a driver system coupled with the switching system, the driver system receiving a system analog input and providing the quantized output to the switching system, the driver system comprising:
      a passive circuit comprising:
         a quantizer coupled with the switching system, the quantizer providing a quantized output representative of a quantizer input signal, and
         a passive filter coupled with the quantizer, the passive filter providing the quantizer input signal according to a passive filter input and a feedback signal from the switching system,
      an active filter, the active filter providing the passive filter input according to a difference between a system analog input and the feedback signal and according to a gain factor, and
      wherein the passive and active filters are second order low pass filters.

2. The amplifier of claim 1, wherein the switching system comprises an h-bridge circuit coupled with the driver system, first and second power supply voltages, and the load, the h-bridge circuit comprising:
   a first switching device selectively coupling a first load terminal with the first power supply voltage according to the quantized output;
   a second switching device selectively coupling the first load terminal with the second power supply voltage according to the quantized output;
   a third switching device selectively coupling a second load terminal with the first power supply voltage according to the quantized output; and
   a fourth switching device selectively coupling the second load terminal with the second power supply voltage according to the quantized output.

3. The amplifier of claim 2, wherein the switching system further comprises a logic circuit coupled with the driver system and the h-bridge circuit, the logic circuit providing first, second, third, and fourth switching signals to the first, second, third, and fourth switching devices, respectively, according to the quantized output.

4. The amplifier of claim 3, wherein the quantized output is a two-level signal having two possible states.

5. The amplifier of claim 4, wherein the logic circuit asserts the first and fourth switching signals when the quantized output is a first state, asserts the second and third switching signals when the quantized output is a second state, and asserts the first and third switching signals, or the second and fourth switching signals, or no switching signals, when the quantized output changes states.

6. The amplifier of claim 3, wherein the logic circuit asserts the first and fourth switching signals when the quantized output is a first state, asserts the second and third switching signals when the quantized output is a second state, and asserts the first and third switching signals, or the second and fourth switching signals, or no switching signals, when the quantized output changes states.

7. The amplifier of claim 2, wherein the switching system activates the first and fourth switching devices when the quantized output is a first state, activates the second and third switching devices when the quantized output is a second state, and activates the first and third switching devices, or the second and fourth switching devices, or no switching devices, when the quantized output changes states.

8. The amplifier of claim 2, wherein the quantized output is a two-level signal.

9. The amplifier of claim 2, wherein poles of the active filter are substantially matched with poles of the passive filter.

10. The amplifier of claim 2, wherein the gain factor is about 25 or more.

11. The amplifier of claim 10, wherein the gain factor is about 250.

12. The amplifier of claim 1, wherein poles of the active filter are substantially matched with poles of the passive filter.

13. The amplifier of claim 1, wherein poles of the active filter are substantially matched with poles of the passive filter.

14. The amplifier of claim 1, wherein poles of the active filter are substantially matched with poles of the passive filter.

15. The amplifier of claim 1, wherein the gain factor is about 25 or more.

16. The amplifier of claim 15, wherein the gain factor is about 250.

17. The amplifier of claim 1, wherein the quantized output is a two-level signal.

18. The amplifier of claim 17, wherein the switching system couples a first load terminal with a first power supply voltage and couples a second load terminal with a second power supply voltage when the quantized output is a first state, couples the first load terminal with the second power supply voltage and couples the second load terminal with the first power supply voltage when the quantized output is a second state, and couples the first and second load terminals with one of the first and second power supply voltages, or with neither supply voltage when the quantized output changes states.

19. The amplifier of claim 1, further comprising a digital delta-sigma modulator providing a two-level system analog input to the driver system.

20. An amplifier driver system for providing a quantized output to a load switching system according to a system analog input, the driver system comprising:
 a passive circuit comprising:
  a quantizer providing a quantized output representative of a quantizer input signal, and
  a passive filter coupled with the quantizer, the passive filter providing the quantizer input signal according to a passive filter input and a feedback signal;
 an active filter, the active filter providing the passive filter input according to a difference between a system analog input and the feedback signal and according to a gain factor, and
 wherein the gain factor is about 25 or more.

21. The amplifier driver system of claim 20, further comprising a digital delta-sigma modulator providing a two-level system analog input to the driver system.

22. The amplifier driver system of claim 20, wherein the quantized output is a two-level signal having two possible states.

23. The amplifier driver system of claim 20, wherein the passive and active filters are second order low pass filters.

24. The amplifier driver system of claim 23, wherein poles of the active filter are substantially matched with poles of the passive filter.

25. The amplifier driver system of claim 20, wherein the gain factor is about 250.

26. An amplifier for driving a load according to a system analog input, the amplifier comprising:
 a passive delta-sigma modulator comprising:
  a passive filter providing a first filtered signal according to a passive filter input and according to a feedback signal, wherein the passive filter is a second order low pass filter,
  a quantizer coupled with the passive filter and providing a quantized output according to the first filtered signal, and
  a switching system coupled with the passive filter and the quantizer, the switching system selectively providing power to a load according to the quantized output and providing the feedback signal to the passive filter; and
 a gain amplifier in a feedback loop around the passive delta-sigma modulator.

27. The amplifier of claim 26, further comprising a second filter in the feedback loop.

28. The amplifier of claim 27, wherein the second filter is a second order low pass filters.

29. The amplifier of claim 27, further comprising a digital delta-sigma modulator providing a two-level system analog input to the amplifier.

* * * * *